United States Patent [19]
Zhao et al.

[11] Patent Number: 5,843,226
[45] Date of Patent: Dec. 1, 1998

[54] ETCH PROCESS FOR SINGLE CRYSTAL SILICON

[75] Inventors: Ganming Zhao, Cupertino; Terry K. Ko, South San Francisco; Weffrey David Chin, Foster City, all of Calif.

[73] Assignee: Applied Materials, Inc., Santa Clara, Calif.

[21] Appl. No.: 680,809

[22] Filed: Jul. 16, 1996

[51] Int. Cl.$^6$ ................................................ C30B 23/00
[52] U.S. Cl. ................................ 117/97; 117/92; 216/64; 216/79
[58] Field of Search ............................ 156/643.1, 646.1, 156/657.1; 216/67, 64, 79, 80, 81; 117/92, 97; 430/714, 719

[56] References Cited

U.S. PATENT DOCUMENTS

| | | | |
|---|---|---|---|
| 4,214,946 | 7/1980 | Forget et al. | 156/643.1 |
| 4,702,795 | 10/1987 | Douglas | 156/643.1 |
| 4,943,344 | 7/1990 | Tachi et al. | 156/643.1 |
| 5,007,982 | 4/1991 | Tsou | 156/643.1 |
| 5,010,378 | 4/1991 | Douglas | 357/23.6 |
| 5,094,712 | 3/1992 | Becker et al. | 156/643 |
| 5,192,702 | 3/1993 | Tseng | 437/47 |
| 5,296,392 | 3/1994 | Grula et al. | 437/34 |
| 5,431,772 | 7/1995 | Babie et al. | 156/643.1 |
| 5,504,033 | 4/1996 | Bajor et al. | 437/67 |

OTHER PUBLICATIONS

Cooper et al., "Magnetically Enhanced RIE Etching of Submicron Silicon Trenches," Proc. SPIE, 1392, 253 (1990) Abstract Only).

Ng et al., "Shallow Trench RIE in Chlorinated Plasma," Electrochem. Soc., 90–14, 681 (1990) (Abstract only).

P.C. Fazan and V.K. Mathews, "A Highly Manufacturable Trench Isolation Process for Deep Submicron DRAMs," IEDM Tech. Dig., pp. 57–60 (1993).

S. Deleonibus et al., "Optimization of a Shallow Trench Isolation Refill Process for High Density Non Volatile Memories Using 100% Chemical–Mechanical Polishing–The Box–On Process," ECS Symposium, pp. 485–491 (1994).

S. Aritome et al., "A 0.67 $\mu m^2$ Self–Aligned Shallow Trench Isolation Cell (SA–STI Cell) for 3V–only 256 Mbit NAND EEPROMs," IEDM Tech. Dig., pp. 61–64 (1994).

A. H. Perera et al., "Trench Isolation for 0.45 $\mu m$ Active Pitch and Below," IEDM Tech. Dig., pp. 679–682 (1995).

"Magnetically Enhanced RIE Etching of Submicron Silicon Trenches" by Cooper et al., Advanced Products Research and Development Laboratory of Motorola, Inc., found in SPIE, vol. 1392, *Advanced Techniques for Integrated Circuit Processing*, 1990.

*Primary Examiner*—Robert Kunemund
*Assistant Examiner*—Luz Alejandro
*Attorney, Agent, or Firm*—Sheldon & Mak

[57] ABSTRACT

A process for etching shallow trenches in single crystal silicon is described. The process etchant comprises HBr/Cl$_2$/O$_2$/He. The process can be used with various mask 24 schemes including, for example, photoresists, oxide hardmasks and nitride hardmasks. The process forms shallow trenches 32 typically having a width of from about 0.25 microns to about 1 micron, and a depth of from about 0.3 microns to about 1 micron. The shallow trenches 32 have rounded bottom corners 38, smooth and continuous sidewalls 34 and substantially flat and clean bottoms 36. For a given trench width, the profile angle is substantially uniform across the single crystal silicon. The trench depth is substantially uniform across the silicon also. In addition, the profile angle is substantially independent of the trench depth. The process can comprise one or two etch steps for etching the single crystal silicon. The two-step etch process forms shallow trenches having varying profile angles with respect to the trench depth.

34 Claims, 2 Drawing Sheets

Fig. 4

ETCH PROCESS FOR SINGLE CRYSTAL SILICON

BACKGROUND

The present invention relates to a process for etching silicon and, more particularly, to a dry etching process for forming shallow trenches in single crystal silicon for use in advanced integrated circuits.

Device isolation technology is critical in the fabrication of advanced integrated circuits. Device geometries are currently below 0.5 microns and are continuing to shrink to 0.35 microns and less. The present device geometries have already surpassed the effectiveness of a number of known isolation techniques.

One such known isolation technique is the LOCOS (local oxidation of silicon) technique. The LOCOS technique comprises the steps of (i) depositing a layer of $Si_xN_y$ on a silicon substrate, (ii) selectively forming openings through the $Si_xN_y$ layer by a reactive ion etching process, and (iii) growing a field oxide of $SiO_2$ on the regions of exposed silicon. A pad oxide is typically provided under the $SiN_y$ layer.

The LOCOS technique, however, has been found to be less than wholly satisfactory for preparing <0.5 micron devices for use in high density integrated circuits. This is because, in order to grow a field oxide of an adequate depth in the silicon openings, the isolation distance between the gates of adjacent transistors must be increased to compensate for the inherent occurrence of "bird's peak encroachment." Bird's peak encroachment occurs when oxidant diffuses laterally and causes the field oxide to grow under and lift the $Si_xN_y$ edges. The shape of the field oxide at the nitride edges resembles a bird's peak. The bird's peak is an extension of the field oxide into the active areas of the devices. Bird's peak encroachment mandates minimum isolation distance requirements and allowances for encroachment of the active device region in the LOCOS technique. This problem limits the minimum feature size achievable in the LOCOS technique to only about 0.5 microns. Thus, the LOCUS technique is incapable of achieving the reduced device geometries presently being demanded, as well as the yet smaller device geometries that will soon be demanded in future generation advance integrated circuits.

Accordingly, the present and future generation device geometries in advanced integrated circuits require alternative device isolation techniques to replace the LOCOS technique. One such alternative isolation technique is trench etch and refill. Refilled trenches have been used in a number of VLSI (very large scale integration) and ULSI (ultra large scale integration) applications. Trench etch and refill processing is critical in the fabrication of electronic devices that exploit three dimensional structural concepts such as trench isolation.

In such trench etch and refill techniques, the processes for forming trenches are characterized generally as being either deep, moderate or shallow trench etch processes. Deep trenches typically have a depth greater than about 3 microns and a width of less than about 2 microns; moderate trenches typically have a depth of from about 1 micron to about 3 microns; and shallow trenches typically have a depth of less than about 1 micron.

A trench etch and refill isolation technique that offers high performance is known as the shallow trench and refill isolation (STI) technique. The STI technique typically comprises the steps of (i) selectively etching the overlying mask material to form patterned mask openings to the substrate, (ii) breakthrough etching the oxide layer overlying the silicon substrate, (iii) anisotropically dry etching the substrate to form shallow trenches, (iv) n or p-type doping the trenches, (v) removing the mask material from the substrate, (vi) refilling the trenches with a dielectric material, and (vii) performing planarization to improve the wafer topography.

Planarization typically includes chemical-mechanical polishing and etch-back steps to remove the mask and the dielectric material above the original substrate surface to produce a planar surface on which to fabricate devices.

The active device regions are those regions protected from the etchant by the mask material during the formation of the trenches.

The mask material is typically a photoresist or a hardmask such as a hardmask nitride or an hardmask oxide. Photoresist masks and hardmasks are typically removed from the substrate by an acid stripping process. During the chemical-mechanical polishing step, hardmasks act as an endpoint mask to prevent undesired damage of the substrate.

It is important in the STI technique to control the trench profile angle, sidewall continuity and smoothness, flatness of the trench bottoms and the shape of the trench bottom corners, and to minimize the etch rate and profile microloading effects. These factors are controlled by the selection of the mask material applied to the silicon substrate and the process parameters used to form the shallow trenches in the substrate.

The trench profile angle typically varies from about 75° to about 90° in the STI process. Generally, as the trench profile angle increases toward 90°, it becomes more difficult to fill the trenches with the dielectric material without forming voids.

Regarding the shape of the trench bottom corners, round corners are highly advantageous to minimize stress related defects and electrical leakage.

It is also advantageous in device applications that the trenches have smooth and continuous sidewalls and flat and clean trench bottom surfaces, to maintain integrity of the oxide and improve device isolation performance.

Profile microloading results when the cross-sectional profile of the features vary as a function of the spacing between the features on the substrate. It is desirable that the etch process produce features having uniform cross-sections regardless of the distance between the features or the density of the features.

In trench etch processes, it is also highly desirable to achieve maximum uniformity of the trench depth and the trench profile angle across the wafer. Particularly, it is preferable that both the trench depth and the trench profile angle be substantially constant between the center and the edge of the wafer. A uniform trench depth enables uniform device performance across the wafer. In addition, it is highly desirable that the trench profile angle be substantially independent of the trench depth, so that the trench depth does not limit the trench profile angle that is achievable in a trench etch process.

Known trench etch processes are unable to achieve the needs of closely controlling the trench profile angle and the shape of the trench bottom corners, forming smooth and continuous trench sidewalls and flat and clean trench bottom surfaces, and minimizing the etch rate and profile microloading effects, in a single crystal silicon shallow etch process.

Accordingly, there is a need for a process for etching shallow trenches in single crystal silicon that provides (i)

rounded trench bottom corners, (ii) a substantially uniform trench depth across the silicon, (iii) for a given trench width, a substantially uniform trench profile angle across the silicon, (iv) trench profile angles substantially independent of the trench depth, (v) smooth and continuous trench sidewalls, and (vi) flat and clean trench bottoms.

SUMMARY

The present invention is directed to a process for etching shallow trenches in single crystal silicon that satisfies the above needs. Particularly, the process achieves (i) rounded trench bottom corners, (ii) a substantially uniform trench depth across the silicon, (iii) for a given trench width, a substantially uniform trench profile angle across the silicon, (iv) a trench profile angle substantially independent of the trench depth, (vi) smooth and continuous trench sidewalls, and (v) flat and clean trench bottoms.

In addition, the present process produces substantially no reentrant profile, undercutting, notching or trenching.

The process of the present invention comprises etching shallow trenches in single crystal silicon. The process comprises the steps of:

(a) introducing into an etching zone a process gas comprised of at least one compound selected from the group consisting of chlorine-containing compounds, fluorine-containing compounds and bromine-containing compounds, and oxygen;

(b) generating a plasma from the process gas; and (c) contacting the single crystal silicon with the plasma to form shallow trenches.

The shallow trenches typically have a depth of from about 0.3 microns to about 1 micron, and trench widths of from about 0.25 microns to about 0.35 microns typically have a profile angle of from about 75° to about 90°. The shallow trenches are characterized as having substantially smooth and substantially continuous sidewalls, a substantially constant depth across the single crystal silicon, a profile angle substantially independent of the trench depth, and substantially rounded bottom corners.

In the process gas, the chlorine-containing compound is typically $Cl_2$. This compound is the primary etchant to etch silicon. The bromine-containing compound is typically HBr. When added along with $Cl_2$, this compound is the secondary gas primarily to passivate the trench sidewalls for profile angle control.

The process gas preferably comprises $O_2$, which provides passivation and oxidizing effects and promotes the formation of rounded bottom corners in the shallow trenches. The oxygen is typically introduced into the etching zone along with an inert diluent gas such as He.

To form the shallow trenches, the single crystal silicon has a mask thereon. The mask can be patterned or unopened. The process can be used for etching single crystal silicon having a variety of mask schemes thereon, including, for example, photoresist masks and oxide and nitride hardmasks. An antireflective coating can be provided in the mask.

The cathode temperature in the etch chamber is typically maintained at from about 10° C. to about 85° C. and preferably at about 60° C. An increased cathode temperature produces shallow trenches having a more vertical trench profile, reduced profile microloading, an enhanced single crystal silicon etch and enhanced bottom corner rounding.

The pressure used in the process is typically from about 20 mTorr to about 150 mTorr, and preferably from 60 mTorr to about 90 mTorr.

The inert gas and $O_2$ are introduced into the chamber at a total flow rate typically of from about 5% to about 30% of the total process gas flow rate. A high flow rate generally promotes the formation of rounded bottom corners. Helium is added as a diluent for $O_2$, typically in the ratio of $He:O_2$ of about 7:3.

The RF power level used is generally from about 200 Watts to about 750 Watts, and preferably from about 300 Watts to about 400 Watts for 6 inch to 8 inch wafer processes. A low power level reduces profile microloading, reduces profile taper in wider trenches, and increases bottom corner rounding.

The process can comprise two main etch steps for etching the single crystal silicon. The first step forms upper sidewall portions having a substantially vertical taper. The second step forms lower sidewall portions having a greater taper than the upper sidewall portions. The second step uses a process gas comprising oxygen to provide rounded bottom corners in the shallow trenches.

DRAWINGS

These and other features, aspects and advantages of the present invention will become better understood from the following drawings, description and appended claims, wherein:

DESCRIPTION

Referring to FIGS. 1a–1d, a flow diagram of the sequence of steps in a typical shallow trench isolation (STI) process is illustrated.

Figure 1A:
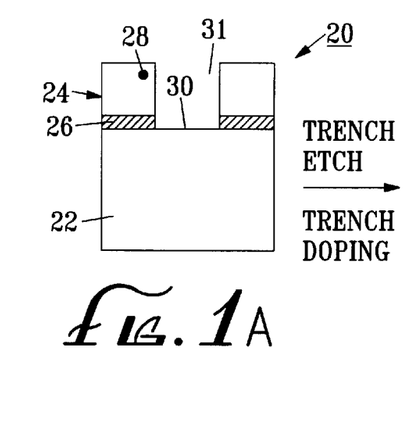
FIGS. 1a–1d illustrate the sequence of steps in a typical shallow trench isolation process.

The process is typically performed on a patterned wafer 20 comprising a substrate 22 and an overlying mask 24. The illustrated mask 24 forms a pattern of openings 31 on the substrate 22.

The substrate 22 is comprised of single crystal silicon. The single crystal silicon is typically a wafer for use in advanced integrated circuit devices. The substrate 22 has an upper surface 30.

The illustrated mask 24 comprises a two-layer structure. The layer 26 on the upper surface 30 of the substrate 22 can, for example, comprise a layer of a nitride material such as $Si_3N_4$ having an underlying $SiO_2$ pad oxide layer (not shown) disposed directly on the upper surface 30 of the substrate 22. A layer 28 disposed on the layer 26 can be comprised, for example, of a photoresist material.

The mask 24 provided on the single crystal silicon substrate 22 can be varied. The following exemplary mask 24 schemes can be formed on the single crystal silicon substrate 22, with the first layer (which is typically a pad oxide) of the mask 24 being formed directly on the upper surface 30 of the substrate 22, and the remaining layers being formed successively on the first layer: pad oxide/nitride/oxide; pad oxide/nitride/photoresist; and pad oxide/nitride.

The nitride layer typically has a thickness of from about 1000 Å to about 3000 Å, and preferably about 1500 Å. The nitride layer is characterized as having high stiffness. This layer is typically deposited using a chemical vapor deposition (CVD) technique.

The pad oxide layer is typically formed between the substrate 22 and the nitride layer to compensate for the high stiffness of the nitride layer. The pad oxide layer typically has a thickness of from about 150 Å to about 250 Å.

The mask 24 can further comprise an organic antireflective coating to reduce reflective notching standing waves and back scattered light, maximize photoresist exposure latitude and optimize photoresist sidewall profiles during the photolithography process. An exemplary mask 24 comprising such an antireflective coating includes the following layers: pad oxide/nitride/antireflective coating/photoresist.

Exemplary organic antireflective coatings are commercially available under the trademark "ARC" from Brewer Science, Inc. of Rolla, Mo. The organic coating generally has a thickness of about 500 Å to about 2500 Å, and typically about 500 Å to about 800 Å.

The photoresist layer 28 is patterned during the photolithographic process. The photoresist is substantially resistant to etching so that the portions of the substrate 22 covered by the photoresist pattern are substantially not etched during the etching of the substrate 22.

Figure 1B:
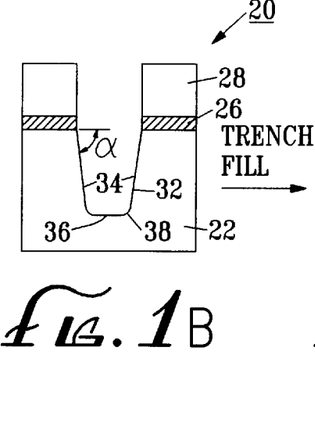

Referring to FIG. 1b, the process according to the invention comprises etching shallow trenches such as the illustrated shallow trench 32 in the substrate 22. The shallow trench 32 includes opposed sidewalls 34, a trench bottom 36 and trench bottom corners 38. The shallow trenches typically have a minimum width of from about 0.25 micron and can range up to about 1 micron, and a depth of from about 0.3 micron to about 1 micron. For shallow trenches having a width of from about 0.25 microns to about 0.35 microns, the shallow trench sidewalls typically have a profile angle α of from about 75° to 90° relative to the original single crystal silicon surface 30.

In accordance with the invention, the shallow trench etch process typically comprises an initial breakthrough etch step and either a one-step or two-step single crystal silicon etch, herein referred to as the "main etch".

The breakthrough etch step is performed to remove any native oxide from the surface 30 of the single crystal silicon substrate 22. An exemplary dry etchant for the breakthrough etch step is $CF_4$. Other suitable etchants can optionally be used.

In the one-step main etch process for the single crystal silicon substrate 22, a trench 32 such as shown in FIG. 1b is etched using a selected process gas composition and process parameters.

Figure 2:
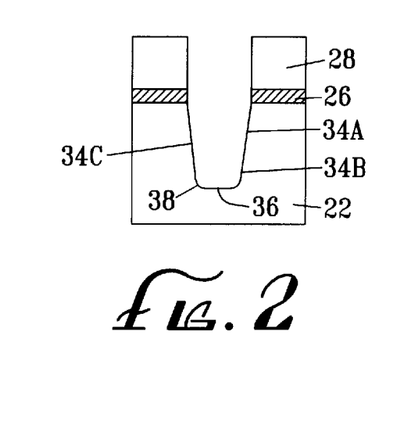
FIG. 2 illustrates a shallow trench profile formed by a two-step main etch process according to the present invention.

In the two-step main etch process for the single crystal silicon substrate 22, the shallow trench 32 is formed by two separate etch steps. Referring to FIG. 2, the first etch step forms substantially vertical upper sidewall portions 34a in the silicon substrate 22. A second etch step then produces tapered lower sidewall portions 34b and rounded bottom corners 38. An interface 34c can form at the location of the transition between the upper sidewall portions 34a and the lower sidewall portions 34b. This interface can be smoothed, for example, by ramping the process pressure.

In accordance with the invention, the one-step main etch is preferred to the two-step main etch for several reasons. Firstly, the one-step etch simplifies the main etch process by eliminating an etch step. Consequently, processing time can be reduced. Secondly, the one-step process eliminates the formation of an interface between the upper sidewall portions and the lower sidewall portions.

Figure 3:
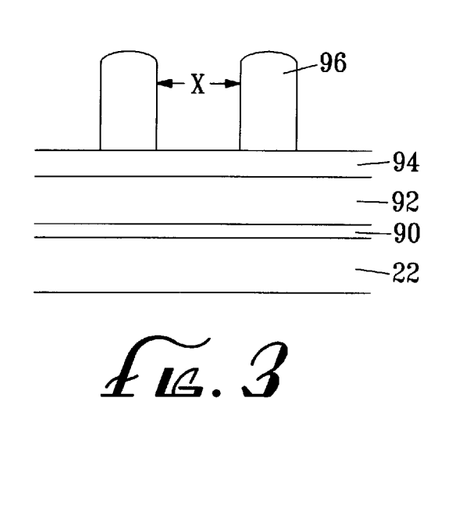
FIG. 3 illustrates a single crystal silicon substrate having an unopened mask thereon prior to etching.

In both the one-step and the two-step shallow trench etch processes, the trenches formed preferably have rounded bottom corners 38 as shown in FIGS. 1b and 3. Rounded bottom corners provide the advantage of minimizing stress related defects and electrical leakage. As also shown in FIG. 1b, it is preferable that the shallow etch process form smooth and continuous sidewalls 34, 34a, 34c and flat and clean trench bottom surfaces 36, to maintain the integrity of the dielectric material 40 and improve device isolation performance.

Figure 1C:
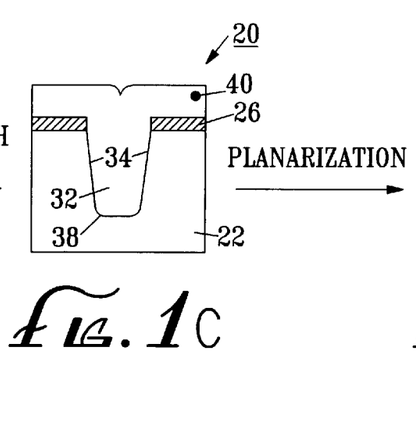

Referring to FIG. 1c, the photoresist layer 28 can be removed from the layer 26, using a conventional stripping solution such as $H_2SO_4/H_2O_2$, prior to refilling the shallow trenches with the dielectric material 40. Following removal of the photoresist, the wafer 20 is typically dipped in a diluted HF solution to remove any passivation present on the sidewalls 34.

The dielectric material is typically $SiO_2$. Other dielectric materials can optionally be used for refilling the shallow trench 32. The dielectric material 40 is typically deposited into the shallow trench 32 using a CVD technique. As shown, the deposited dielectric material 40 fills the trench 32 and extends above the layer 26.

Figure 1D:
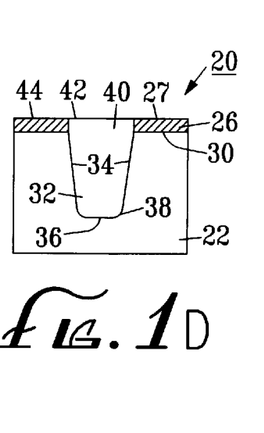

Referring to FIG. 1d, planarization is typically performed to remove the dielectric material 40 above the layer 26, to make the top surface 42 of the dielectric material 40 level with the top surface 27 of the layer 26. This leveling can be achieved by a conventional chemical-mechanical polishing step. During this step, the layer 26 can function as an endpoint mask.

Following planarization, the nitride and pad oxide are removed for subsequent device processing.

Figure 4:
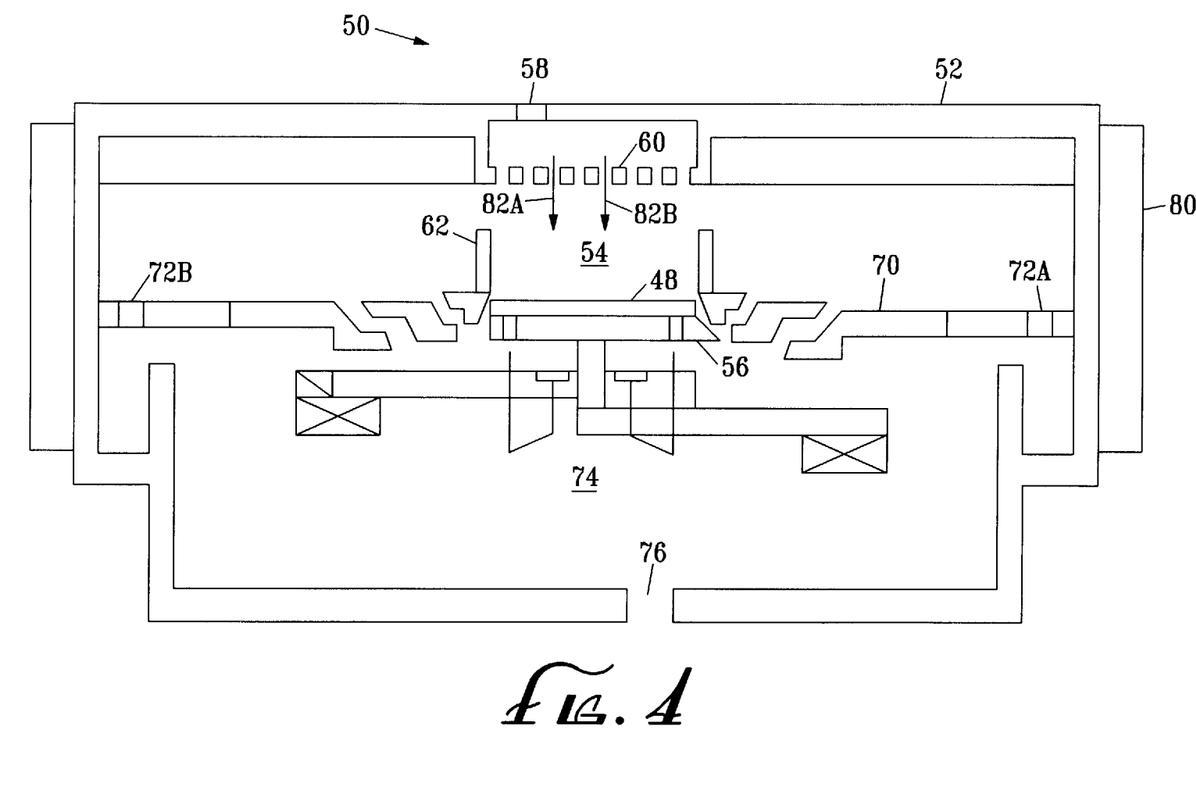
FIG. 4 is a schematic view in vertical cross-section of an apparatus suitable for practicing the process of the present invention.

Referring to FIG. 4, a reaction apparatus 50 suitable for practicing the present invention comprises an etch chamber 52 having an etch zone 54. Process gas is introduced into the etch chamber 52 through a gas inlet 58. The process gas then passes through a "showerhead" diffuser plate 60 which distributes the process gas in the etch zone 54. A surrounding focus ring 62 substantially maintains the generated plasma in the etch zone 54.

A barrier or pumping plate 48 defines a plurality of exhaust holes 72a, 72b therethrough and separates the etch chamber 52 into two zones; namely, the etch zone 54 and a non-etching zone 74. The exhaust holes 72a, 72b are in fluid communication with a vacuum pump (not shown) via an exhaust port 76 for exhausting spent process gas and volatile etch byproducts from the etch chamber 52.

The reaction chamber 50 can be magnetically enhanced. A magnetic coil 80 can be provided around the etch chamber 52 to magnetically enhance the plasma from the process gas in the etch zone 54.

In operation, a patterned wafer 20 such as shown in FIG. 1a is placed on the cathode 56 and a process gas is introduced through the gas inlet 58 into the etch chamber 52. A plasma is generated from the process gas in the etch zone 54 to etch the substrate 22. The flow of the plasma is represented by the arrows 82a and 82b.

In accordance with the present invention, the process gas used in the main etch process for etching single crystal silicon comprises at least one of a bromine-containing gas, a chlorine-containing gas, and a fluorine-containing gas.

The chlorine-containing gas is typically $Cl_2$. This gas is the primary etchant to etch single crystal silicon.

The bromine-containing gas is typically HBr. When added with $Cl_2$, this gas is the secondary gas primarily to passivate the trench sidewalls for profile angle control.

The fluorine-containing gas can be, for example, $SF_6$, $CF_4$, or $NF_3$.

The oxygen is preferably in the form of $O_2$. The oxygen increases passivation of the sidewalls 34 of the shallow trench 32 and also oxidizes the single crystal silicon substrate 22. This passivation and oxidation enhances rounding of the trench bottom corners 38.

The process gas preferably further comprises an inert dilutent gas, typically He. Helium and oxygen gas mixtures, herein referred to as "He—$O_2$", are commercially available.

The process gas can comprise an effective amount of a fluorine-containing gas such as, for example, one or more of $CF_4$, $SF_6$, $NF_3$ or the like, to eliminate the occurrence of micromasking. Micromasking can limit the taper of the shallow trenches, for a given feature size, that can be achieved in the shallow trench etch process for a process gas comprising HBr/$Cl_2$/He—$O_2$. The addition of $CF_4$, for example, to this process gas composition can eliminate micromasking and enable a greater degree of taper to be achieved for the shallow trench sidewalls. For example, a taper of less than about 75° can be achieved for about 0.3 micron features by this addition. A typical process gas flow is 90 sccm HBr/30 sccm $Cl_2$/20 sccm He-$O_2$/10 sccm fluorine-containing gas.

The amount of the fluorine-containing gas that is added is closely controlled, as excess additions of this gas can produce substantially vertical sidewalls in the shallow trenches. Accordingly, a fluorine-containing gas is preferably only added to the process gas when micromasking occurs.

The process gas is varied by adjusting the total flow rate of HBr/$Cl_2$/He—$O_2$, the flow ratio of HBr/$Cl_2$, and the ratio of the total flow of He—$O_2$ to the total flow of the process gas.

For 8 inch wafers, the total flow rate of the process gas is typically from about 80 sccm to about 200 sccm.

The flow ratio of HBr/$Cl_2$ is generally from about 1:1 to about 10:1, and typically about 3:1. This ratio can be varied to alter the shallow trench profile. The HBr/$Cl_2$ ratio has only a minimal effect on trench profile for highly tapered shallow trenches.

The volumetric ratio of He/$O_2$ is typically about 7:3. This mixture is commercially available.

The total flow rate of He—$O_2$ is typically from about 10 sccm to about 40 sccm, and preferably from about 15 sccm to about 30 sccm. A high He—$O_2$ flow rate promotes the formation of rounded trench bottom corners. A high He—$O_2$ flow rate also enhances throughput, by enhancing the single crystal silicon etch rate. Increasing the He—$O_2$ total flow above about 15 sccm does not significantly change the shallow trench profile.

For photoresist masks, the nominal etch rate for single crystal silicon is typically from about 2500 Å/min to about 4000 Å/min.

The total flow of He—$O_2$ is preferably from about 10% to about 20% of the total flow of the process gas to achieve significant corner rounding. As the total flow of He—$O_2$ increases to more than about 20 sccm, micromasking of etch byproducts and polymers on the surface of the single crystal silicon can occur.

In the two-step main etch process, He—$O_2$ is typically only added to the process gas in the second main etch step and not during the first step. The second etch step forms the bottom portion of the shallow trenches including the trench bottom corners and, accordingly, He—$O_2$ is added during this step to enhance rounding of the trench bottom corners.

The plasma is generated from the process gas to etch the single crystal silicon substrate 22 in the etch steps. The RF power used to generate the plasma is generally from about 200 Watts to about 750 Watts, and typically about 400 Watts. A low power level provides the advantages of reducing the profile taper in generally wider trenches, reducing profile microloading, and increasing trench bottom corner rounding, especially in generally wider trenches. Reducing the power also reduces the etch rate of the single crystal silicon substrate.

The plasma can be enhanced using, for example, electron cyclotron resonance, magnetically enhanced reactors and inductively coupled plasma. Preferably, a magnetically enhanced ion reactor is used. The magnetic field in the reaction apparatus 50 induced by the magnetic coil 80 must be sufficiently strong to increase the density of ions formed in the plasma. The magnetic field on the surface of the single crystal silicon substrate 22 is generally from about 10 Gauss to about 80 Gauss, and typically about 30 Gauss.

The pressure in the etch chamber 52 is typically maintained at from about 20 mTorr to about 150 mTorr, and preferably at from about 60 mTorr to about 90 mTorr. The pressure significantly affects localized trenching and the formation of convex shaped trench bottom surfaces. These undesired effects occur at low pressures due to enhanced ion bombardment near the trench bottom corners. Excessively high pressures may prevent highly tapered profiles. A pressure of about 60 mTorr achieves flat trench bottom surfaces and tapered sidewalls. The pressure used also depends on the mask scheme.

The temperature of the cathode 56 affects the shallow trench profile and the occurrence of microloading. The cathode temperature is typically maintained at from about 10° C. to about 85° C., and preferably at about 60° C. An increased cathode temperature produces shallow trenches having a more vertical trench profile angle, reduces profile microloading, enhances the single crystal silicon etch rate and enhances trench bottom corner rounding.

The process according to the present invention achieves a high degree of etch rate uniformity of the single crystal silicon for various mask schemes. Particularly, the process achieves less than about 3% etch rate non-uniformity of single crystal silicon substrates for photoresist masks, nitride hardmasks and oxide hardmasks.

The process according to the invention also achieves a high degree of etch depth uniformity in single crystal silicon. Particularly, the process achieves an etch depth non-uniformity across single crystal silicon substrates of less than about 3% for nominal shallow trench widths ranging from 0.25 micron to 1 micron and larger.

In addition, the process according to the invention achieves a high degree of shallow trench profile angle uniformity in single crystal silicon. For a given trench width, the process achieves substantially uniform trench profile angles across single crystal silicon substrates for nominal shallow trench widths ranging from 0.25 microns to 1 micron.

EXAMPLES

The following examples demonstrate the efficacy of the present invention for forming shallow trenches in single crystal silicon.

The examples were conducted using a magnetically enhanced reactive ion reactor and, in particular, either a 6 inch or 8 inch M×P Polysilicon etch chamber on a "Precision 5000" platform available from Applied Materials, Inc., Santa Clara, Calif.

The wafers tested were 6 inch (150 mm) (Examples 1–22) and 8 inch (200 mm) (Examples 23–37) single crystal silicon wafers having a (100) orientation. Several wafer mask schemes were evaluated to determine their influence on the process results.

Following performance of the etch process, the wafers were evaluated. Particularly, the trench depth, trench width, and trench profile including the side wall profile angle, bottom flatness and bottom corner roundness, were determined using an Hitachi Model S-4500 scanning electron microscope (SEM). In addition, the selectivity (Si:mask) of the etchant was evaluated using SEM photomicrographs and a Prometrix Model UV-1050 thin film thickness measurement system.

EXAMPLES 1–12

In Examples 1–12, a hardmask oxide was formed on the single crystal silicon wafers. The mask used in these examples comprised the following layers in succession on the single crystal silicon substrate: 110 Å pad oxide/2000 Å SiN/1500 Å oxide. The mask was patterned. The process conditions used are presented in TABLE 1 as follows.

Decreasing the $HBr/Cl_2$ ratio in the second main etch step in Example 5 also had no measurable effect on bottom corner rounding. A slightly bowed profile also resulted.

In Example 6, $He—O_2$ was added to the process gas in the second main etch step only. The $He—O_2$ addition improved the roundness of the trench bottom corners as compared to Examples 1–5 in which $He—O_2$ was not added to the process gas. A trench profile angle of about 88°–89° and a trench depth of about 4350 Å were measured.

Example 7 included only a single main etch step using an $HBr/Cl_2/He—O_2$ process gas. The resulting trenches did not have a vertical top sidewall portions. Micromasking also occurred.

In Example 8, the second main etch step time was increased, and the ratio of the time of the first step to the time of the second step was decreased. The resultant shallow trenches had an upper sidewall portion angle of greater than 87°, and improved bottom corner rounding as compared to Example 6.

Example 9 reduced the flow ratio of $HBr/Cl_2$ in the second main etch step from 3:1 to 1:1. No measurable effect on trench bottom corner rounding resulted. In addition, a slightly bowed profile occurred.

TABLE 1

PROCESS CONDITIONS FOR EXAMPLES 1–12

| EXAMPLE | MASK | STEP | TIME (sec) | PRESSURE (mTorr) | POWER (Watt) | B (Gauss) | FLOW RATE (SCCM) | | |
|---|---|---|---|---|---|---|---|---|---|
| | | | | | | | HBr | $Cl_2$ | $He—O_2$ |
| 1 | hard oxide | M.E. | 180 | 50 | 400 | 30 | 60 | 20 | |
| 2 | hard oxide | M.E. | 70 | 20 | 400 | 30 | 60 | 20 | |
| 3 | hard oxide | M.E. | 76 | 20 | 400 | 30 | 60 | 20 | |
| 4 | hard oxide | M.E.1 | 70 | 20 | 400 | 30 | 60 | 20 | |
| | | M.E.2 | 15 | 20 | 400 | 30 | 70 | 10 | |
| 5 | hard oxide | M.E.1 | 70 | 20 | 400 | 30 | 60 | 20 | |
| | | M.E.2 | 15 | 20 | 400 | 30 | 20 | 60 | |
| 6 | hard oxide | M.E.1 | 70 | 20 | 400 | 30 | 60 | 20 | |
| | | M.E.2 | 15 | 20 | 400 | 30 | 60 | 20 | 10 |
| 7 | hard oxide | M.E.2 | 90 | 20 | 400 | 30 | 60 | 20 | 10 |
| 8 | hard oxide | M.E.1 | 50 | 20 | 400 | 30 | 60 | 20 | |
| | | M.E.2 | 25 | 20 | 400 | 30 | 60 | 20 | 10 |
| 9 | hard oxide | M.E.1 | 50 | 20 | 400 | 30 | 60 | 20 | |
| | | M.E.2 | 25 | 20 | 400 | 30 | 40 | 40 | 10 |
| 10 | hard oxide | M.E.1 | 50 | 20 | 400 | 30 | 60 | 20 | |
| | | M.E.2 | 25 | 20 | 400 | 30 | 60 | 20 | 20 |
| 11 | hard oxide | M.E.1 | 50 | 20 | 400 | 30 | 60 | 20 | |
| | | M.E.2 | 25 | 20 | 200 | 30 | 60 | 20 | 20 |
| 12 | hard oxide | M.E.1 | 50 | 20 | 400 | 30 | 60 | 20 | |
| | | M.E.2 | 25 | 20 | 400 | 100 | 60 | 20 | 20 |

In Examples 1–3, a one-step main etch process ("M.E.") was performed on the masked wafers. The process gas comprised $HBr/Cl_2$ and no $He—O_2$. Example 1 constituted the initial process setup. Trenching and bowing occurred.

In Example 2, the pressure was reduced to 20 mTorr and the etch time was reduced to 70 sec. The trenches exhibited a vertical profile and a shallow depth of only about 3700 Å.

The etch time was increased in Example 3 to correct for this shallow trench depth. The trenches had a vertical profile, sharp, non-rounded bottom corners and an increased depth of about 4000 Å.

In Examples 4 and 5, a two-step main etch process was performed on the wafers using a $HBr/Cl_2$ process gas. "M.E.1" represents the first main etch step and "M.E.2" represents the second main etch step.

Example 4 was conducted to attempt to increase the degree of rounding of the trench bottom corners. Increasing the $HBr/Cl_2$ ratio in the second main etch step caused no significant improvement in bottom corner rounding. A profile angle of about 89.5° and a trench depth of about 4000 Å resulted.

Example 10 increased the total flow rate of $He—O_2$ in the second main etch step from 10 sccm to 20 sccm. The increased flow rate of $He—O_2$ improved trench bottom corner rounding.

Example 11 was conducted to determine the effect of reducing the power in the second main etch step from 400 Watts to 200 Watts. No measurable improvement in the shallow trench profile resulted.

Example 12 examined the effect of increasing the applied magnetic field in the second main etch step from 30 Gauss to 100 Gauss. An enhanced taper of the sidewall bottom portions resulted.

EXAMPLES 13–17

Examples 13–17 were conducted to evaluate the effects of a photoresist mask on the shallow trenches formed in the etch process. The mask used in these examples comprised the following layers in succession on the single crystal silicon substrate: 110 Å pad oxide/2000 Å $Si_xN_y$/3100 Å photoresist. The mask was patterned. The process conditions used in these examples are given in TABLE 2 below.

TABLE 2

PROCESS CONDITIONS FOR EXAMPLES 13–17

| EXAMPLE | MASK | STEP | TIME (sec) | PRESSURE (mTorr) | POWER (Watt) | B (Gauss) | FLOW RATE (SCCM) | | |
|---|---|---|---|---|---|---|---|---|---|
| | | | | | | | HBr | $Cl_2$ | $He-O_2$ |
| 13 | photoresist | M.E. | 100 | 20 | 400 | 30 | 60 | 20 | |
| 14 | photoresist | M.E. | 100 | 80 | 400 | 30 | 60 | 20 | |
| 15 | photoresist | M.E. | 100 | 90 | 400 | 30 | 60 | 20 | |
| 16 | photoresist | M.E. | 70 | 100 | 400 | 30 | 60 | 20 | |
| 17 | photoresist | M.E.1 | 70 | 90 | 400 | 30 | 60 | 20 | |
| | | M.E.2 | 30 | 90 | 400 | 30 | 60 | 20 | 20 |

In Examples 13–16, the etch process comprised a single main etch step and the process gas comprised $HBr/Cl_2$ and no $He-O_2$. Example 13 was the initial process setup. Highly tapered trench sidewalls having an angle of less than 80° were observed.

In Example 14, the pressure was increased from 20 mTorr to 80 mTorr. A slightly tapered profile of about 87° and a trench depth of about 4150 Å were produced.

In Example 15, the pressure was increased further to 90 mTorr. An enhanced vertical profile of greater than 87° was produced.

In Example 16, the pressure was increased further to 100 mTorr. Slightly reentrant and very shallow trenches having a depth of about 2650 Å resulted.

Example 17 comprised a two-step main etch. $He-O_2$ was added to the process gas in the second etch step. The resulting trenches had a depth of 4600 521 , an improved profile with vertical upper sidewall portions having an angle greater than about 87°, lower sidewall portions tapered at about 77°, and rounded bottom corners.

EXAMPLES 18–22

Examples 18–22 evaluated the effects of a hardmask nitride on the shallow trenches formed in the etch process. The mask used in these examples comprised the following layers in succession on the single crystal silicon substrate: 110 Å pad oxide/2000 Å hard nitride. The mask was patterned. The process conditions used in these examples are given in TABLE 3 as follows.

no $He-O_2$. Example 18 was the initial process setup. Highly tapered trench sidewalls were produced.

In Example 19, etch time was reduced and the pressure was increased to 100 mTorr. The resulting trenches were shallow, having a depth of about 3800 Å, and had a slight "S" shaped profile.

In Example 20, the etch time was increased to that of Example 18, and the pressure was reduced to 50 mTorr. The trenches had a profile angle of 86°, slight notching, and a depth of about 5850 Å.

In Examples 21 and 22, a two-step main etch was used to increase the roundness of the trench bottom corners. The shallow trenches formed in Example 21 showed an improved profile with vertical upper sidewall portions and round bottom corners. Reducing the pressure to 20 mTorr in the second etch step in Example 22 formed upper sidewall portions having a profile angle greater than about 87° and improved the smoothness of the bottom corners.

Examples 1–22 demonstrate the effect of the mask scheme on the results of the etch process according to the invention. For identical $HBr/Cl_2/He-O_2$ process conditions, the trench sidewall profile angle and trench bottom corner rounding increase (i.e., taper decreases) in the following order: photoresist/hardmask nitride/hardmask oxide. Also, the etch rate for photoresist is lower than for hardmask nitride and hardmask oxide.

EXAMPLES 23–33

In Examples 23–33, single crystal silicon wafers having an opened mask thereon were evaluated. The mask comprised the following layers formed successively on the single crystal silicon substrate: 150 Å pad oxide/2000 Å hardmask nitride/800 Å antireflective coating/5000 Å pho-

TABLE 3

PROCESS CONDITIONS FOR EXAMPLES 18–22

| EXAMPLE | MASK | STEP | TIME (sec) | PRESSURE (mTorr) | POWER (Watt) | B (Gauss) | FLOW RATE (SCCM) | | |
|---|---|---|---|---|---|---|---|---|---|
| | | | | | | | HBr | $Cl_2$ | $He-O_2$ |
| 18 | nitride | M.E. | 100 | 20 | 400 | 30 | 60 | 20 | |
| 19 | nitride | M.E. | 70 | 100 | 400 | 30 | 60 | 20 | |
| 20 | nitride | M.E. | 100 | 50 | 400 | 30 | 60 | 20 | |
| 21 | nitride | M.E.1 | 50 | 150 | 400 | 30 | 60 | 20 | |
| | | M.E.2 | 25 | 150 | 400 | 30 | 60 | 20 | 20 |
| 22 | nitride | M.E.1 | 50 | 150 | 400 | 30 | 60 | 20 | |
| | | M.E.2 | 25 | 20 | 400 | 30 | 60 | 20 | 20 |

In Examples 18–20, the etch process comprised a single main etch step and the process gas comprised $HBr/Cl_2$ and toresist. The process conditions employed are presented in TABLE 4 as follows.

TABLE 4

PROCESS CONDITIONS FOR EXAMPLES 23–35

| EXAMPLE | STEP | TIME (sec) | PRESSURE (mTorr) | POWER (Watt) | B (Gauss) | HBr | $Cl_2$ | He—$O_2$ | $NF_3$ | $SF_6$ | $CF_4$ | CATHODE TEMP (°C.) |
|---|---|---|---|---|---|---|---|---|---|---|---|---|
| 23 | B.T. | 15 | 100 | 400 | 0 | — | — | — | — | — | 35 | 40 |
|  | M.E.1 | 60 | 20[1] | 375 | 30 | 160 | 16 | — | — | — | — |  |
|  | M.E.2 | 30 | 80 | 550 | 30 | 80 | 10 | 20 | — | — | — |  |
| 24 | B.T. | 10 | 20 | 400 | 0 | — | — | — | — | — | 35 | 40[2] |
|  | M.E.1 | 60 | 20 | 375 | 30 | 120 | 12 | — | — | — | — |  |
|  | M.E.2 | 30 | 80 | 550 | 30 | 80 | 10 | 20 | — | — | — |  |
| 25 | B.T. | 10 | 20 | 400 | 0 | — | — | — | — | — | 35 | 40[2] |
|  | M.E. | 90 | 90 | 600 | 30 | 90 | 30 | 15 | — | — | — |  |
| 26 | B.T. | 10 | 20 | 400 | 0 | — | — | — | — | — | 35 | 40[2] |
|  | M.E. | 90 | 90 | 600 | 30 | 90 | 30 | — | — | — | — |  |
| 27 | B.T. | 10 | 20 | 400 | 0 | — | — | — | — | — | 35 | 40[2] |
|  | M.E. | 90 | 60 | 600 | 30 | 90 | 30 | — | — | — | — |  |
| 28 | B.T. | 30 | 100 | 400 | 0 | — | — | — | — | — | 35 | 40 |
|  | M.E. | 60 | 60 | 600 | 30 | 90 | 30 | 15 | — | — | — |  |
| 29 | M.E.1 | 60 | 60 | 650 | 30 | 100 | 10 | — | — | — | — | 40 |
|  | M.E.2 | 15 | 60 | 650 | 30 | 100 | 10 | 20 | — | — | — |  |
| 30 | B.T. | 10 | 20 | 300 | 0 | — | — | — | — | — | 35 | 40 |
|  | M.E. | 80 | 30 | 375 | 30 | 100 | 10 | 10 | — | — | — |  |
| 31 | B.T. | 10 | 100 | 400 | 0 | — | — | — | — | — | 35 | 60 |
|  | M.E. | 60 | 60 | 600 | 30 | 90 | 30 | 15 | — | — | — |  |
| 32 | B.T. | 30 | 100 | 400 | 0 | — | — | — | — | — | 35 | 60 |
|  | M.E. | 115 | 60 | 400 | 30 | 90 | 30 | 15 | — | — | — |  |
| 33 | B.T. | 30 | 100 | 400 | 0 | — | — | — | — | — | 35 | 60 |
|  | M.E. | 90 | 60 | 400 | 30 | 90 | 30' | 15 | — | — | — |  |
| 34 | BARC | 60 | 20 | 200 | 30 | — | — | 18 | — | — | 10 | 60 |
|  | nitride M.E. | 55 | 125 | 350 | 30 | — | — | — | — | 80 | — |  |
|  | nitride O.E. | 20 | 200 | 200 | 30 | — | — | — | — | 80 | — |  |
|  | B.T. | 30 | 100 | 400 | 0 | — | — | — | — | — | 35 |  |
|  | Si | 90 | 60 | 400 | 30 | 90 | 30 | 15 | — | — | — |  |
| 35 | BARC | 60 | 20 | 200 | 30 | — | — | 18 | — | — | 10 | 60 |
|  | nitride M.E. | 45 | 125 | 350 | 30 | — | — | — | — | 80 | — |  |
|  | nitride O.E. | 20 | 200 | 200 | 30 | — | — | — | — | 80 | — |  |
|  | B.T. | 30 | 100 | 400 | 0 | — | — | — | — | — | 35 |  |
|  | Si | 90 | 60 | 400 | 30 | 90 | 30 | 15 | — | — | — |  |

[1]pressure = 33 mT
[2]cathode temperature is greater than whole wafer temperature These examples were conducted to examine the effects of He—$O_2$ flow, pressure, RF power and cathode temperature on the resultant shallow trench profile and on microloading effects.

A breakthrough etch step was used in Examples 23–28 and 30–33 to remove any remaining pad oxide resulting from the preliminary mask open process and any native oxide on the single crystal silicon surface. The etchant used in this step was $CF_4$.

Example 23 was performed to scale up to the 8 inch wafer size process based on two-step 6 inch process conditions. The process gas comprised HBr/$Cl_2$/He—$O_2$/$NF_3$ in the main etch step.

Example 24 comprised a two-step main etch to attempt to obtain vertical upper sidewall portions and rounded trench bottom corners. One-step main etch processes were performed in Examples 26 and 27 in which He—$O_2$ was not added in the process gas, and in Examples 25–28 and 30–33 in which He—$O_2$ was added in the process gas.

The results from Examples 23–33 demonstrated that the He—$O_2$ flow, pressure, RF power and cathode temperature have varying effects on the resultant shallow trench profile and on etch rate microloading.

The results for Example 33 are given in TABLE 5 and TABLE 6 below.

TABLE 5

EXAMPLE 35 TRENCH PROFILE ANGLE*

| TRENCH WIDTH (μm) PROFILE ANGLE | 0.25 | 0.3 | 0.3 | 0.5 | 1.0 | open |
|---|---|---|---|---|---|---|
| Center | 86° | 85° | 85° | 84° | 78° | 74° |
| Edge | 86° | 85° | 85° | 85° | 77° | 77° |

*Data obtained from SEM photos

TABLE 6

EXAMPLE 35 TRENCH DEPTH NON-UNIFORMITY[1]

| TRENCH WIDTH (μm) DEPTH (Å) | 0.25 | 0.3 | 0.3 | 0.5 | 1.0 | open |
|---|---|---|---|---|---|---|
| Center | 3940 | 3940 | 3940 | 4040 | 4060 | 3940 |
| Edge | 4150 | 4190 | 4190 | 4300 | 4250 | 4110 |
| NON-UNIFORMITY (max-min)/(2)(avg) | 2.6% | 3.1% | 3.1% | 3.1% | 2.3% | 2.1% |

[1]Data obtained from SEM photos.
Trench depth uniformity: 4.4% [(max-min)/(2 × average from all trench depth data in TABLE 6)
Etch rate: 2670 Å/min (evaluated using SEM)
Profile: smooth continuous sidewalls, round bottom corners, flat trench bottoms, no bowing (evaluated using SEM)

As shown in TABLE 5, the one-step main etch process of Example 33 achieves for a given trench width highly uniform profile angles across the single crystal silicon substrate, especially for nominal trench widths ranging from 0.25 microns to about 0.30 microns.

As shown in TABLE 6, the process parameters of Example 33 also achieved a high degree of trench depth uniformity for nominal trench widths ranging from about 0.25 micron to about 1.0 micron, and in open trenches. The trench depth non-uniformity was no greater than about 3.1% for this range of trench widths. In addition, the shallow trenches exhibited smooth and continuous sidewalls, round bottom corners, flat bottoms and no bowing.

An etch rate of about 2670 Å/min for the single crystal silicon substrate was measured in Example 33.

Regarding the He—$O_2$ flow, the results for Examples 23–33 demonstrated that a high He—$O_2$ flow rate achieves rounded trench bottom corners. In Example 33, an etch rate of about 2670 Å/min was achieved for a He—$O_2$ flow rate of 15 sccm.

Pressure was demonstrated to have an effect on eliminating convex trench bottom surfaces and sharp bottom corners in wider trenches. A higher pressure eliminated the formation of convex bottom surfaces. An excessive pressure, however, can be detrimental to trench sidewall taper. In Example 28, a pressure of 60 mTorr in the main etch step achieved flat trench bottom surfaces for all trench sizes, and highly tapered sidewalls having angles of about 80° for nominal 0.25 micron trenches and about 65° for 1 micron trenches.

The Examples further demonstrated that a high cathode temperature improves sidewall taper and reduces profile microloading. In order to minimize profile microloading between the nominal 0.25 micron and nominal 1 micron features of Example 28, the cathode temperature was increased to 60° C. in Examples 31–33. The resulting trench profile angles improved to about 85° for the nominal 0.25 micron trenches and to about 73° for the nominal 1 micron trenches. In addition, trench bottom corner rounding was increased.

Regarding the RF power used in the etch process, a low power was determined to minimize profile microloading. In Examples 32 and 33, the RF power was reduced from 600 Watts used in Example 31 to 400 Watts. The reduced RF power reduced profile taper more effectively on the wider trenches than on the narrow trenches. Low power also increased bottom corner rounding in Example 33. A reduced single crystal silicon etch rate of about 2670 Å/min also resulted. As shown in TABLE 5, a profile angle of 86° was achieved in the nominal 0.25 micron trenches, and a profile angle of about 77° was achieved in the nominal 1 micron trenches.

Some notching was observed at the top of the trench profiles in Examples 23–33. This was caused by heavy polymer deposition on the mask prior to the main trench etch and by mask erosion during the main trench etch.

A heavy sidewall deposition was formed by the mask open process. It is believed that sidewall deposition was heavier in the wider open areas. Consequently, the deposited polymer was eroded during the main trench etch, and larger notched corners were observed in the wider trenches.

In addition, some residue caused by micromasking was observed. This residue is believed to have been caused by an incomplete nitride mask open process.

EXAMPLES 34 AND 35

A combined in-situ mask open and shallow trench etch process was evaluated for two wafers. As depicted in FIG. 3, in Examples 34 and 35, the mask formed on the single crystal silicon substrate 22 comprised the following successive layers: pad oxide 90/nitride hardmask 92/antireflective coating 94/photoresist 96. These layers had the following thicknesses: 150 Å pad oxide/2000 Å nitride hardmask/800 Å antireflective coating/7500 Å photoresist. The patterned photoresist layer defined openings, x, sized from about 0.25 micron to about 1 micron. The process conditions used are given in TABLE 4.

The antireflective coating ("BARC") was etched using a $CF_4$/He—$O_2$ etchant. The nitride layer was etched using an $SF_6$ etchant in a main etch step and an overetch ("O.E.") step. In the main etch step for the single crystal silicon substrate to form shallow trenches, the etchant comprised HBr/$Cl_2$/He—$O_2$.

The etch rate and selectivity results for the antireflective coating and nitride etch steps of Examples 34 and 35 are presented in TABLE 7 below.

TABLE 7

ETCH RATE AND SELECTIVITY

| STEP | CONDITIONS | ETCH RATE (Å/min.) BARC | ETCH RATE (Å/min.) Nitride | ETCH RATE (Å/min.) Pad Oxide | SELECTIVITY ARC/Nitride | SELECTIVITY nitride/Pad Oxide |
|---|---|---|---|---|---|---|
| BARC | 20mT/200W/30G/18HeO$_2$/10CF$_4$ | 935 | 2250 | — | 0.42 | — |
| Nitride M.E. | 125mT/350W/30G/80SF$_6$ | — | 2400 | 762 | — | 3.1 |
| Nitride O.E. | 200mT/200W/30G/80SF$_6$ | — | 724 | 205 | — | 3.5 |

Example 35 produced smooth trench sidewalls, flat trench bottom surfaces and round bottom corners. In addition, no residue and no top corner notching were observed. Some rounding of the shallow trench top corners resulted.

Based on Example 35, the process according to the invention is an effective in-situ mask open and shallow trench etch process for single crystal silicon wafers.

Thus, the present process for etching shallow trenches in single crystal silicon achieves (i) rounded trench bottom corners, (ii) a substantially uniform trench depth across the silicon, (iii) for a given trench width, a substantially uniform trench depth and trench profile angle across the single crystal silicon, (iv) a trench profile angle substantially independent of the trench depth, (v) smooth and continuous trench sidewalls, and (v) flat and clean trench bottoms.

In addition, the present process produces substantially no reentrant profile, undercutting, notching or trenching.

Furthermore, the present process can be used to etch single crystal silicon having different mask schemes.

The present process can comprise one or two main etch steps, depending on the desired shallow trench profile.

Also, the present invention provides an effective in-situ mask open and shallow trench etch process for single crystal silicon wafers.

The present invention has been described in considerable detail with reference to certain preferred embodiments thereof, however, other embodiments are possible. Therefore, the spirit and scope of the appended claims should not be limited to the description of the preferred embodiments contained herein.

What is claimed is:

1. A process for etching shallow trenches in single crystal silicon, the process comprising the steps of:
   (a) placing into a chamber a single crystal silicon having a patterned mask thereon;
   (b) introducing into the chamber a first process gas comprising HBr and $Cl_2$;
   (c) generating a first plasma of the first process gas in the chamber;
   (d) contacting the single crystal silicon with the first plasma in the chamber to etch upper trench portions having upper sidewall portions of a first profile angle in the single crystal silicon;
   (e) introducing into the chamber a second process gas comprising HBr, $Cl_2$ and oxygen;
   (f) generating a second plasma of the second process gas in the chamber; and
   (g) contacting the single crystal silicon with the second plasma in the chamber to etch lower trench portions having lower sidewall portions of a second profile angle in the single crystal silicon,
   wherein the upper sidewall portions and the lower sidewall portions comprise the sidewall of the shallow trenches, and the shallow trenches comprise a trench bottom and bottom corners.

2. The process of claim 1, wherein the second process gas comprises $O_2$.

3. The process of claim 1, wherein the second process gas comprises an inert gas and $O_2$.

4. The process of claim 1, wherein the first profile angle is greater than the second profile angle.

5. The process of claim 4, wherein the bottom corners of the shallow trenches are substantially rounded.

6. A process for etching shallow trenches in single crystal silicon, the process comprising the steps of:
   (a) placing single crystal silicon;
   (b) introducing into the chamber a process gas comprising HBr, $Cl_2$, an inert gas and $O_2$;
   (c) generating a plasma of the process gas in the chamber; and
   (d) contacting the single crystal silicon with the plasma in the chamber to etch shallow trenches in the single crystal silicon, the shallow trenches comprising opposed sidewalls, a bottom wall and bottom corners,
   wherein the shallow trenches have (i) rounded bottom corners, (ii) for a given trench width, a substantially uniform trench depth and trench profile angle across the single crystal silicon, (iii) a trench sidewall profile angle substantially independent of the trench depth, (iv) smooth and continuous trench sidewalls, and (v) substantially flat bottoms.

7. A process for etching shallow trenches in single crystal silicon, the process comprising the steps of:
   (a) placing a single crystal silicon into a chamber;
   (b) introducing into the chamber a process gas comprising chlorine, bromine, oxygen and an inert gas;
   (c) generating a plasma of the process gas in the chamber; and
   (d) contacting the single crystal silicon with the plasma in the chamber to etch shallow trenches in the single crystal silicon, the shallow trenches having (i) a depth of less than about 1 micron, and (ii) a substantially uniform trench depth and trench profile angle across the single crystal silicon for a given trench width.

8. The process of claim 7, wherein the process gas further comprises an effective amount of a fluorine containing compound to substantially eliminate micromasking.

9. The process of claim 7, wherein the shallow trenches have a depth of from about 0.3 microns to about 0.5 microns.

10. The process of claim 9, wherein the shallow trenches have a width of from about 0.25 microns to about 0.35 microns and a sidewall profile angle of from about 75° to about 85°.

11. A process for etching shallow trenches in single crystal silicon, the process comprising the steps of:
    (a) placing a single crystal silicon into a chamber;
    (b) introducing into the chamber a process gas comprised of chlorine, bromine, oxygen and an inert gas;
    (c) generating a plasma of the process gas in the chamber; and
    (d) contacting the single crystal silicon with the plasma in the chamber to etch shallow trenches in the single crystal silicon,
    wherein the shallow trenches have (i) a sidewall profile angle of from about 75° to about 85°, and (ii) for a given trench width, a trench depth uniformity of less than about 3% and a substantially uniform sidewall profile angle across the single crystal silicon.

12. The process of claim 11, wherein the process gas further comprises an effective amount of a fluorine containing compound to substantially eliminate micromasking.

13. A process for etching shallow trenches in single crystal silicon, the process comprising the steps of:
    (a) placing a single crystal silicon on a cathode in a chamber, the cathode having a temperature of at least 60° C. and the chamber having a pressure of from about 60 mTorr to about 90 mTorr;
    (b) introducing into the chamber a process gas comprising chlorine, bromine, oxygen and an inert gas;
    (c) generating a plasma of the process gas in the chamber; and
    (d) contacting the single crystal silicon with the plasma in the chamber to etch shallow trenches in the single crystal silicon, the shallow trenches having (i) a depth of less than about 1 micron, and (ii) a substantially uniform trench depth and trench profile angle across the single crystal silicon for a given trench width of the shallow trenches.

14. The process of claim 13, wherein the process gas comprises $O_2$.

15. The process of claim 14, wherein the inert gas and $O_2$ are introduced into the chamber at a total flow rate of from about 5% to about 30% of the total flow rate of the process gas.

16. The process of claim 13, wherein the inert gas is helium.

17. The process of claim 13, wherein the bromine-containing compound comprises HBr.

18. The process of claim 13, wherein the chlorine-containing compound comprises $Cl_2$.

19. The process of claim 13, wherein the process gas comprises HBr, $Cl_2$ and oxygen.

20. The process of claim 19, wherein the flow ratio of HBr to $Cl_2$ is from about 1:1 to about 10:1.

21. The process of claim 13, wherein the shallow trenches have a depth of from about 0.3 microns to about 1 micron.

22. The process of claim 13, wherein the shallow trenches have a width of from about 0.25 microns to about 0.35 microns and a sidewall profile angle of from about 75° to about 90°.

23. The process of claim 13, wherein the shallow trenches have substantially rounded bottom corners and substantially flat bottoms.

24. The process of claim 13, wherein the shallow trenches comprise substantially smooth sidewalls.

25. The process of claim 13, wherein the shallow trenches have a sidewall profile angle substantially independent of the depth thereof.

26. The process of claim 13, wherein the step of placing into a chamber a single crystal silicon comprises placing the single crystal silicon on a cathode having a temperature of from about 10° C. to about 85° C.

27. The process of claim 13, wherein the pressure in the chamber is from about 20 mTorr to about 150 mTorr.

28. The process of claim 13, wherein the step of generating a plasma comprises applying an RF current having a power level of from about 200 Watts to about 750 Watts.

29. The process of claim 13, wherein the step of contacting the single crystal silicon with the plasma in the chamber comprises substantially anisotropically etching the single crystal silicon to form shallow trenches.

30. The process of claim 13, wherein the process gas further comprises an effective amount of a fluorine containing compound to substantially eliminate micromasking.

31. The process of claim 13, wherein the fluorine-containing compound comprises a compound selected from the group consisting of $CF_4$, $SF_6$ and $NF_3$.

32. A process for etching shallow trenches in single crystal silicon, the process comprising the steps of:

(a) placing a single crystal silicon on a cathode in a chamber, the cathode having a temperature of at least 60° C. and the chamber having a pressure of from about 60 mTorr to about 90 mTorr;

(b) introducing into the chamber a process gas comprising chlorine, bromine, $O_2$ and He, the $O_2$ and He being introduced at a flow rate of from about 10% to about 20% of the total flow rate of the process gas;

(c) generating a plasma of the process gas in the chamber; and (d) contacting the single crystal silicon with the plasma in the chamber to etch shallow trenches in the single crystal silicon, the shallow trenches having (i) a depth of less than about 0.5 micron and a width of less than about 0.3 microns, (ii) a substantially uniform trench depth and trench profile angle across the single crystal silicon for a given trench width of the shallow trenches, and (iii) rounded bottom corners.

33. The process of claim 32, wherein the process gas further comprises an effective amount of a fluorine containing compound to substantially eliminate micromasking.

34. A process for etching shallow trenches in single crystal silicon, comprising the steps of:

(a) placing a single crystal silicon having a patterned photoresist mask thereon on a cathode in an etching zone, the cathode being at a temperature of at least 60° C.;

(b) introducing into the etching zone a process gas comprising HBr, $Cl_2$ and oxygen;

(c) generating a plasma from the process gas; and (d) contacting the single crystal silicon with the plasma to form shallow trenches.

* * * * *